US009525405B2

(12) United States Patent
Stenger et al.

(10) Patent No.: US 9,525,405 B2
(45) Date of Patent: Dec. 20, 2016

(54) MITIGATION OF COMMON MODE DISTURBANCES IN AN H-BRIDGE DRIVER

(71) Applicant: Avago Technologies General IP (Singapore) Pte. Ltd., Singapore (SG)

(72) Inventors: Joseph D. Stenger, Woodbury, MN (US); Cameron C. Rabe, Inver Grove Heights, MN (US); Jason P. Brenden, Woodbury, MN (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/608,344

(22) Filed: Jan. 29, 2015

(65) Prior Publication Data

US 2016/0204771 A1 Jul. 14, 2016

Related U.S. Application Data

(60) Provisional application No. 62/101,981, filed on Jan. 9, 2015.

(51) Int. Cl.
*H03B 1/00* (2006.01)
*H03K 5/01* (2006.01)
*H03K 3/012* (2006.01)

(52) U.S. Cl.
CPC .............. *H03K 5/01* (2013.01); *H03K 3/012* (2013.01)

(58) Field of Classification Search
USPC ........................ 327/108–112, 379, 389, 391, 92,327/423–424, 493–508, 587, 588; 326/22–27, 326/81–87
See application file for complete search history.

(56) References Cited

U.S. PATENT DOCUMENTS

| | | | | |
|---|---|---|---|---|
| 7,193,443 B1* | 3/2007 | Smith | ............ | H03K 19/018528 326/27 |
| 7,355,449 B1* | 4/2008 | Tran | ................. | H03K 19/17732 326/82 |
| 7,372,649 B2 | 5/2008 | VanEaton et al. | | |
| 7,557,615 B1* | 7/2009 | Tran | ................. | H03K 19/17732 326/82 |
| 8,218,259 B2 | 7/2012 | Mukhopadhyay et al. | | |
| 8,699,161 B2 | 4/2014 | Livshitz et al. | | |
| 2007/0013411 A1* | 1/2007 | Asaduzzaman | ...... | H03K 17/164 326/83 |
| 2008/0310046 A1* | 12/2008 | Menegoli | ............. | H03F 1/0227 360/75 |
| 2009/0140778 A1* | 6/2009 | Kikuchi | ............. | H03F 3/45197 327/108 |
| 2012/0074987 A1* | 3/2012 | Piepenstock | ... | H03K 19/018528 327/108 |
| 2012/0162189 A1* | 6/2012 | Ebuchi | ............. | H03K 19/00361 345/212 |
| 2015/0097821 A1* | 4/2015 | Shi | ........................ | G09G 3/2096 345/211 |
| 2015/0169488 A1* | 6/2015 | Metzner | .............. | G06F 13/4022 710/316 |

* cited by examiner

Primary Examiner — Brandon S Cole

(57) ABSTRACT

A method for reducing common-mode disturbances during power-on and power-off modal transitions in a current driver includes providing a programmable current source operative to generate a current having a controllable rise-time and controlling the programmable current source such that a rise-time of the current generated by the current driver is set to a first rise-time value during power-on and power-off modes of operation and is set to a second rise-time value during polarity transitions in a data mode of operation of the current driver, the first rise-time value being greater than the second rise-time value.

19 Claims, 8 Drawing Sheets

MITIGATION OF COMMON MODE DISTURBANCES IN AN H-BRIDGE DRIVER

CROSS-REFERENCE TO RELATED APPLICATION(S)

This application claims the benefit of U.S. Provisional Patent Application No. 62/101,981 filed on Jan. 9, 2015, the complete disclosure of which is expressly incorporated by reference herein in its entirety for all purposes.

FIELD OF INVENTION

The present invention relates generally to electrical and electronic circuitry, and more particularly relates to driver methods and circuitry.

BACKGROUND

In a conventional H-bridge current mode driver circuit, there exists a potential for power-up timing differences between P-type and N-type transistors in the driver circuit, which generate differences in current magnitude between sink and source current paths in the circuit. In an ideal scenario, the respective currents in the P-type and N-type transistors are identically matched in magnitude and timing, and thus common mode circuitry in the driver circuit would not be required to sink or source any current thereby allowing the driver circuit to maintain a prescribed common mode voltage level. However, any difference between the respective currents in the P-type and N-type transistors requires the common mode circuitry to deliver a mismatch current. The finite output impedance of the common mode circuitry in combination with the voltage (i.e., current× resistance (IR)) drop of the mismatch current results in a disturbance in the common mode voltage level.

SUMMARY

In accordance with an embodiment of the invention, a method for reducing common-mode disturbances during power-on and power-off modal transitions in a current driver includes providing a programmable current source operative to generate a current having a controllable rise-time, and controlling the programmable current source such that a rise-time of the current generated by the current driver is slower during power-on and power-off modes of operation and decreases during polarity transitions in a data mode of operation of the current driver. Other embodiments of the invention include, but are not limited to, being manifest as a current driver circuit for reducing common-mode disturbances during power-on and power-off modal transitions, an integrated circuit including at least one current driver circuit, and an electronic system. Additional and/or other embodiments of the invention are described in the following written description, including the claims, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that the drawings described herein are presented for illustrative purposes only. Moreover, common but well-understood elements and/or features that may be useful or necessary in a commercially feasible embodiment may not be shown in order to facilitate a less hindered view of the illustrated embodiments.

Written Description

Embodiments of the invention will be described herein in the context of illustrative driver circuits for use, for example, with a magnetic recording system in a data storage application. It should be understood, however, that embodiments of the invention are not limited to these or any other particular circuit arrangements or applications. Rather, embodiments of the invention are more broadly applicable to techniques for reducing common mode disturbances in a driver circuit attributable, at least in part, to mismatches between P-type and N-type transistors in the driver circuit. Moreover, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
| --- | --- |
| IR | Current (I) × Resistance (R) |
| DC | Direct current |

-continued

Table of Acronym Definitions

| Acronym | Definition |
| --- | --- |
| BJT | Bipolar junction transistor |
| PVT | Process, voltage and temperature |
| pF | Picofarad |
| PMOS | P-channel metal-oxide-semiconductor |
| NMOS | N-channel metal-oxide-semiconductor |
| FET | Field-effect transistor |

Figure 1:
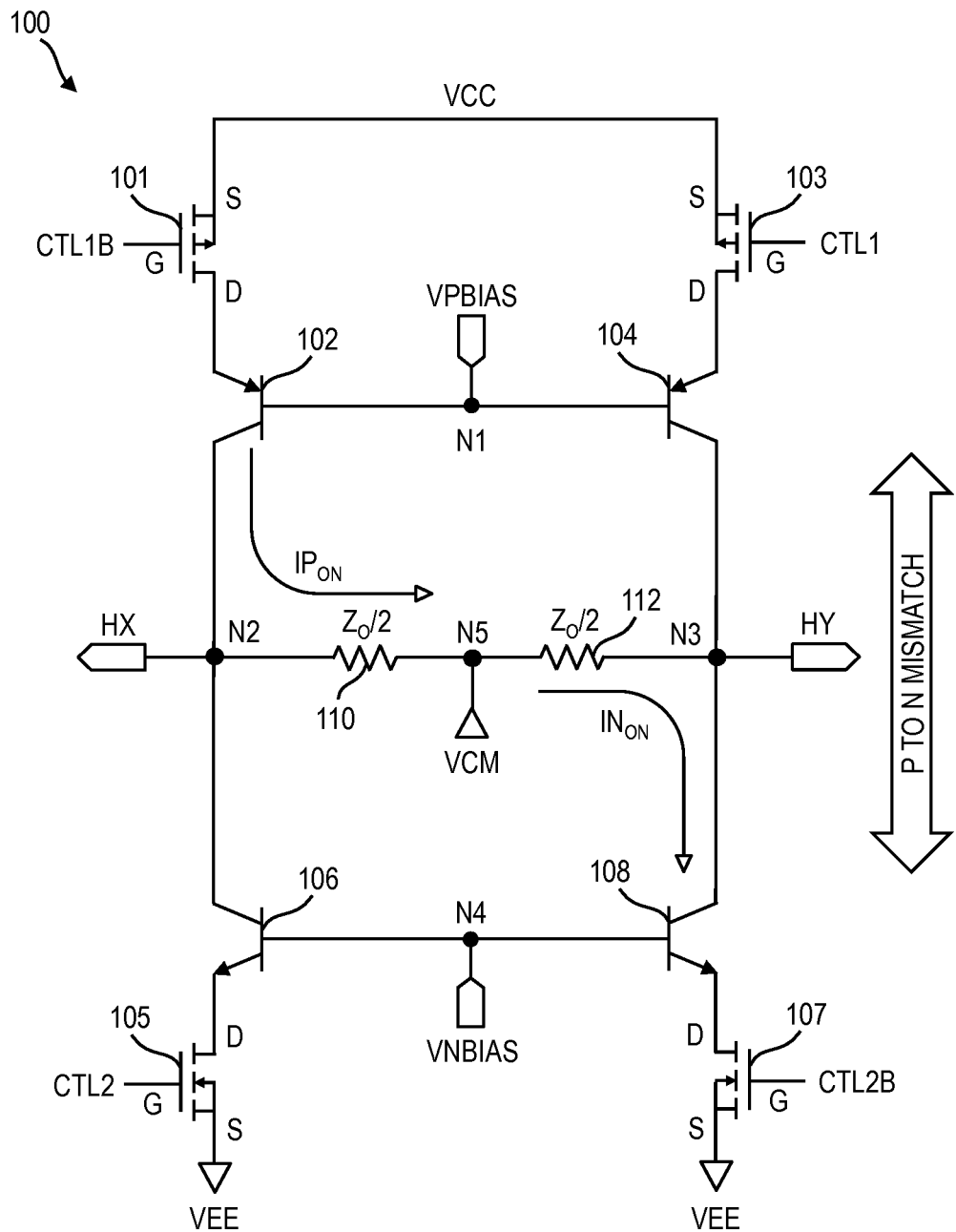
FIG. 1 is a schematic diagram depicting at least a portion of an exemplary H-bridge current driver circuit which conceptually illustrates a potential for power-up timing differences between P-type and N-type transistors in the circuit.

FIG. 1 is a schematic diagram depicting at least a portion of an exemplary H-bridge current driver circuit 100 which conceptually illustrates a potential for power-up timing differences between P-type and N-type transistors in the circuit. An H-bridge is a well-known electronic circuit arrangement that enables a voltage or current to be applied across a load in either direction. These circuits are often used in driving current through inductive write heads used in a hard disk drive application and other applications. In the context of a write head application, one benefit of an H-bridge circuit is that the current can be driven in either direction, optionally using a completely independent power source.

With reference to FIG. 1, the driver circuit 100 includes a first P-type transistor 101, which in this embodiment is a P-channel metal-oxide-semiconductor (PMOS) field-effect transistor (FET), a second P-type transistor 102, which in this embodiment is a PNP bipolar junction transistor (BJT), a third P-type transistor 103, which in this embodiment is a PMOS FET, a fourth P-type transistor 104, which in this embodiment is a PNP BJT, a first N-type transistor 105, which in this embodiment is an N-channel metal-oxide-semiconductor (NMOS) FET, a second N-type transistor 106, which in this embodiment is an NPN BJT, a third N-type transistor 107, which in this embodiment is an NMOS FET, and a fourth N-type transistor 108, which in this embodiment is an NPN BJT.

The PMOS and NMOS transistors 101, 103, 105 and 107 in the driver circuit 100 function essentially as switches which are configured to connect the H-bridge core (comprising transistors 102, 104, 106, 108) to respective voltage supplies VCC and VEE as a function of corresponding control signals, CTL1B, CTL1, CTL2, CTL2B, respectively, applied to the PMOS and NMOS devices. Specifically, emitters of the PNP transistors 102 and 104 are connected to drains (D) of the PMOS devices 101 and 103, respectively, and sources (S) of the PMOS devices 101 and 103 are connected with a first voltage source, which in this embodiment is VCC. Bases of the PNP transistors 102 and 104 are connected together at node N1 and are adapted to receive a first bias signal, which in this embodiment is VPBIAS, a collector of PNP transistor 102 is connected with a collector of NPN transistor 106 at node N2 and forms a first output, HX, of the driver circuit 100, and a collector of PNP transistor 104 is connected with a collector of NPN transistor 108 at node N3 and forms a second output, HY, of the driver circuit. Emitters of the NPN transistors 106, 108 are connected to drains of the NMOS devices 105 and 107, respectively, and sources of the NMOS devices 105 and 107 are connected with a second voltage source, which in this embodiment is VEE or ground. Bases of the NPN transistors 106, 108 are connected together at node N4 and are adapted to receive a second bias signal, which in this embodiment is VNBIAS.

A gate (G) of PMOS transistor 103 is adapted to receive a first control signal, CTL1, a gate of PMOS transistor 101 is adapted to receive a second control signal, CTL1B, which in one or more embodiments during normal power-on operation is a complement of the first control signal, a gate of NMOS transistor 105 is adapted to receive a third control signal, CTL2, and a gate of NMOS transistor 107 is adapted to receive a fourth control signal, CTL2B, which in one or more embodiments during normal power-on operation is a complement of the third control signal. During power off operation, CTL1B is not necessarily a complement of CTL1; likewise for control signals CTL2B and CTL2. Rather, in one or more embodiments, during power off operation, CTL1B and CTL1 are both high, and CTL2B and CTL2 are both low.

Figure 2:
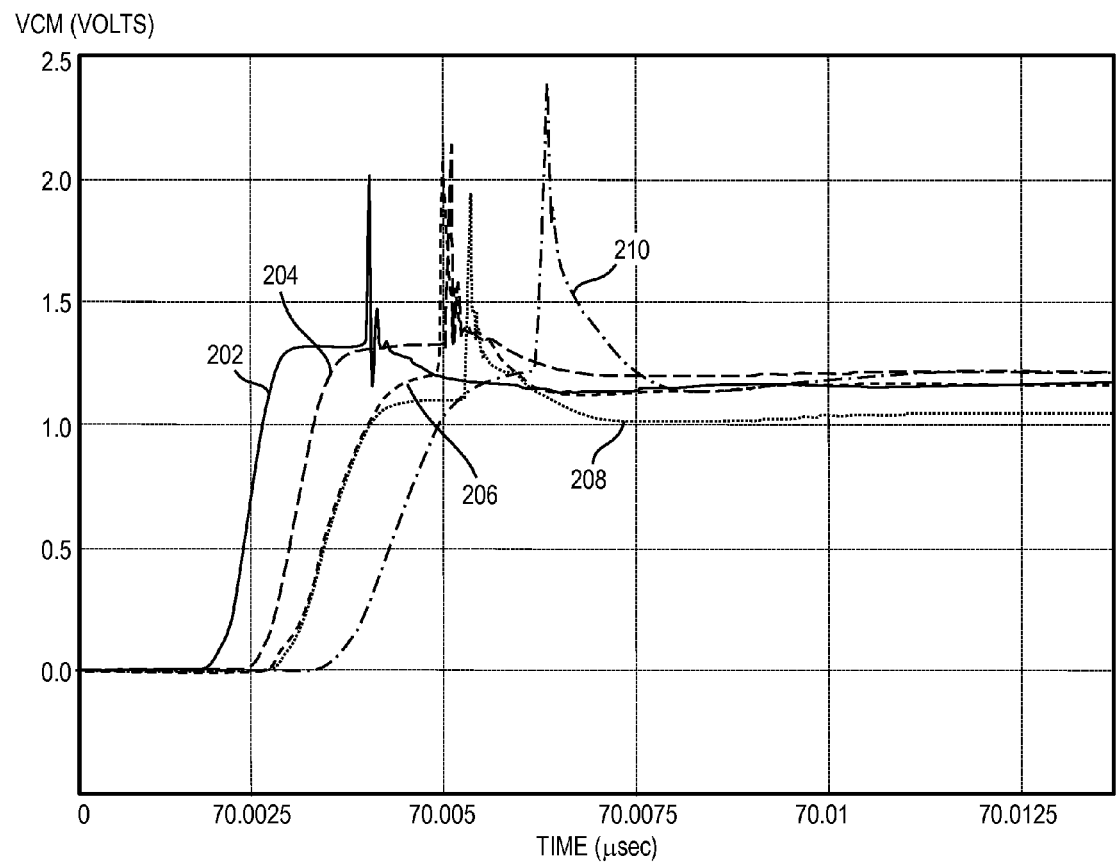
FIG. 2 is a graph depicting exemplary simulation results of output common mode voltage of the illustrative driver circuit shown in FIG. 1 for different process and temperature corners.

In the illustrative scenario depicted in FIG. 2, during power-on operation, control signal CTL1 is asserted high, thereby turning off transistor 103, and CTL1B will be low, thereby turning on transistor 101. Likewise, control signal CTL2 is asserted low, thereby turning off transistor 105, and signal CTL2B will be high, thereby turning on transistor 107. With the control signals configured in this manner, a current $IP_{ON}$ will be sourced by transistor 102 and a current $IN_{ON}$ will be sinked by transistor 108, as shown in FIG. 2.

The driver circuit 100 further includes common mode circuitry which, in this embodiment, comprises a load represented by first and second resistors, 110 and 112, connected in series across the outputs HX and HY. Specifically, a first terminal of the first resistor 110 is connected with the first output HX at node N2, a second terminal of resistor 110 is connected with a first terminal of the second resistor 112 at node N5, and a second terminal of resistor 112 is connected with the second output HY at node N3. The voltage, VCM, at node N5 is driven by another circuit with low but finite output impedance to a voltage that is half-way between the two voltage sources VCC and VEE and forms an output common mode voltage of the driver circuit 100. The first and second resistors 110, 112 each have a resistance of $Z_0/2$, and therefore the common mode voltage VCM measured between nodes N2 and N3 (i.e., $(V_{N2}+V_{N3})/2$), and at node N5 under ideal operating conditions will be half-way between the two voltage sources VCC and VEE; that is, $$VCM = \frac{VCC + VEE}{2}.$$

Ideally, node N5 is driven (e.g., through a buffer or other voltage source) to a voltage level of (VCC+VEE)/2 to maximize headroom, but with finite output impedance.

As previously stated, in an ideal scenario, the currents sourced by the PNP transistors 102, 104 ($IP_{ON}$) are identically matched with the currents sinked by the NPN transistors 106, 108 ($IN_{ON}$) in magnitude and timing. In this ideal scenario, the common mode circuitry would not be required to sink or source any current, thereby maintaining a prescribed common mode voltage level VCM. Unfortunately, this ideal scenario is rarely achieved. Under more practical operating conditions, there will be a mismatch in magnitude and/or timing between the currents in the PNP and NPN transistors requiring the common mode circuitry to deliver a current, referred to herein as a mismatch current, equal to a difference between the respective currents in the PNP and NPN transistors. The finite output impedance of the common mode circuitry in combination with the IR drop of the mismatch current across the resistors 110 and 112 results in a disturbance (e.g., a spike) in the common mode voltage $(V_{N2}+V_{N3})/2$ (In this illustrative embodiment, VCM is actually referring to an average of the voltages at HX and HY; node N5 is an internal node not accessible to the user.). These disturbances in the expected common mode voltage level can be very significant (e.g., greater than one volt), which can lead to undesired coupling into other circuitry. In a magnetic recording system, reduction of common mode transients is an important performance consideration to avoid damage to sensitive magnetic read/write heads in the system.

FIG. 2 is a graph depicting exemplary simulation results of output common mode voltage (HX+HY)/2 (i.e., an average of output voltages HX and HY) of the driver circuit 100 shown in FIG. 1 for different process and temperature corners. With reference to FIG. 2, waveform 202 represents output common mode voltage VCM at a temperature of zero degrees Celsius (° C.) and fast semiconductor fabrication process parameters (i.e., "fast devices"), waveform 204 represents output common mode voltage VCM at a temperature of 135° C. and fast process parameters, waveform 206 represents output common mode voltage VCM at a temperature of 0° C. and slow process parameters (i.e., "slow devices"), waveform 208 represents output common mode voltage VCM at a temperature of 100° C. and nominal process parameters (i.e., "nominal devices"), and waveform 210 represents output common mode voltage VCM at a temperature of 135° C. and slow process parameters. For the simulation results shown in FIG. 2, VCC was set at about 5.0 volts (nominal) and VEE was set at about −3.0 volts (nominal), so that VCM=(5.0−3.0)/2=1.0 volts (nominal). The waveforms 202 through 210 were obtained using slight variations in the supply voltages VCC and VEE within a prescribed tolerance (e.g., ±10% of nominal).

The simulation results depicted in FIG. 2 illustrate common mode disturbances during an initial write current, $I_W$, transient turn-on. In the context of a magnetic recording system application, the write current $I_W$ may be the writer current flowing through a read/write head, and may therefore be referred to herein as writer current. The common mode voltage VCM initially biases up to prescribed values of about 1.0 volt as the VCM driver biases on, however the common mode voltage exhibits a significant disturbance at the first write current data transition due to transistors 102 and 108 turning on. As apparent from FIG. 2, the common mode disturbances for the various operating corners appears as large spikes (e.g., ranging from about 0.8 volt to about 1.2 volts in magnitude) in the output common mode voltage level. Similar common mode disturbances may occur during power-down of the write current $I_W$, in which case sequence transitioning from fast rise-time back to slow rise-time would be reversed, according to one or more embodiments, compared to the sequence transitioning used for $I_W$ turn-on, as will become apparent to those skilled in the art given the teachings herein.

Figure 3:
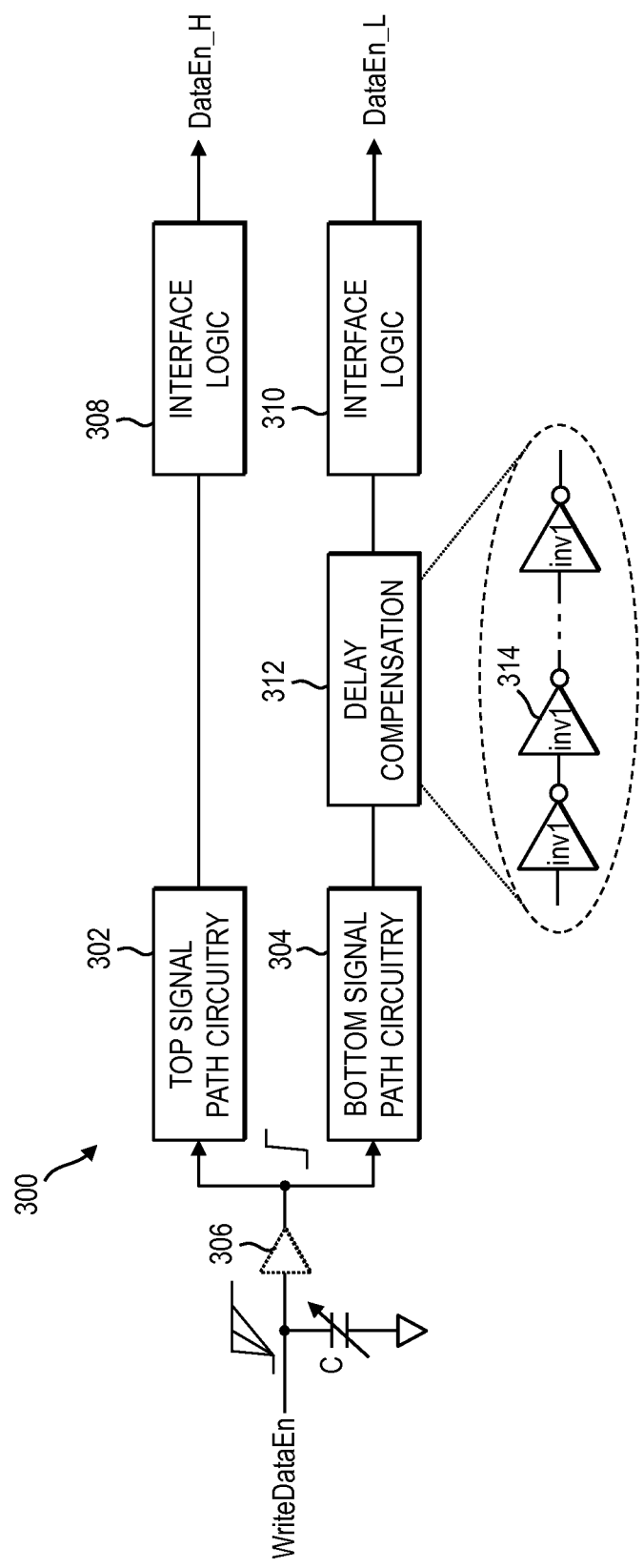
FIG. 3 is a block diagram depicting at least a portion of an exemplary driver circuit which includes delay compensation circuitry for balancing top and bottom signal paths in the driver circuit.

One way to alleviate these disturbances in the common mode voltage is to put significant effort into balancing timing delays of the top (i.e., comprising the P-type transistors) and bottom (i.e., comprising the N-type transistors) signal paths. FIG. 3 is a block diagram depicting at least a portion of an exemplary driver circuit 300 which includes delay compensation circuitry for balancing the top and bottom signal paths. Specifically, the driver circuit 300 includes top signal path circuitry 302 and bottom signal path circuitry 304 each adapted to receive, as an input thereto, a write data enable signal, WriteDataEn. The write data enable signal will exhibit a variable rise-time due at least in part to a capacitance, C, which varies as a function of channel count (e.g., about 0.5 to 2.5 picofarad (pF)). In order to provide a more constant rise-time regardless of variations in the channel capacitance C, the write data enable signal WriteDataEn may optionally be passed through a buffer 306 connected in series with an input to the driver circuit 300.

In one or more embodiments, the top signal path circuitry 302 and the bottom signal path circuitry 304 are connected to different power supply domains. For example, in an exemplary driver circuit configuration, the top signal path circuitry 302 is referenced between VCC and VCC−1.5V, and the bottom signal path circuitry 304 is referenced between VEE+1.5V and VEE. Thus, although buffer 306 is shown as generating a single output signal in FIG. 3, buffer 306, in one or more embodiments, actually functions as a voltage level translator configured to generate two separate write data enable signals as inputs to corresponding top and bottom signal path circuitry. Each of these write data enable signals should track well in time; however, parasitic capacitance (C) loading on each of these two separate power domain input signals may vary in practice.

An output of the top signal path circuitry 302 is supplied to a first interface logic circuit 308 connected with the top signal path circuitry. Likewise, an output of the bottom signal path circuitry 304 is supplied to a second interface logic circuit 310 coupled with the bottom signal path circuitry. Assuming the top signal path circuitry 302 has a higher delay associated therewith compared to the bottom signal path circuitry 304, a delay compensation circuit 312 is connected in series between the bottom signal path circuitry 304 and the second interface logic circuit 310. If the bottom signal path circuitry 304 had a higher delay compared to the top signal path circuitry 302, the delay compensation circuit 312 would be placed in series with the top signal path circuitry. Alternatively, delay compensation circuitry may be placed in series with both the top and bottom signal path circuitry (not explicitly shown, but implied), with a delay value of each of the respective delay compensation circuits adjusted accordingly to match the timing of the source and sink currents.

In one or more embodiments, the delay compensation circuit 312 comprises a plurality of individual delay blocks 314, represented herein as a plurality of inverters (inv1) configured in a delay chain, each of the delay blocks having a prescribed delay associated therewith. Assuming the delay associated with each of the delay blocks 314 is essentially the same relative to one another, an overall delay value of the delay compensation circuit 312 is controlled as a function of the total number of delay blocks employed.

While the approach of balancing timing delays of the top and bottom signal paths may be somewhat effective in reducing common mode disturbances under nominal (i.e., normal or typical) process, voltage and temperature (PVT) conditions without device mismatch taken into account, very small differences in timing (e.g., on the order of tens of picoseconds) can result in large common mode disturbances. As such, this approach does not provide a robust solution. Moreover, this balanced timing approach, even if perfectly matched under one set of PVT conditions, does not track well over variations in PVT conditions to which the driver circuit may be subjected.

In an alternative embodiment of the driver circuit, common mode disturbances can be reduced by slowly ramping the analog bias voltages VPBIAS and VNBIAS used to bias the P-type and N-type transistors, respectively. In an illustrative scenario, the rise-time is adjusted to be much slower than a nominal rise-time; for example, about 4 nanoseconds (ns). Unfortunately, in the context of a magnetic recording system application, this ramping must be performed quickly to ensure that the transistors in the driver circuit are fully biased within a required nine nanoseconds (ns) read-to-write specification, thus rendering the simultaneous fast ramp and bias tracking infeasible.

Figure 4:
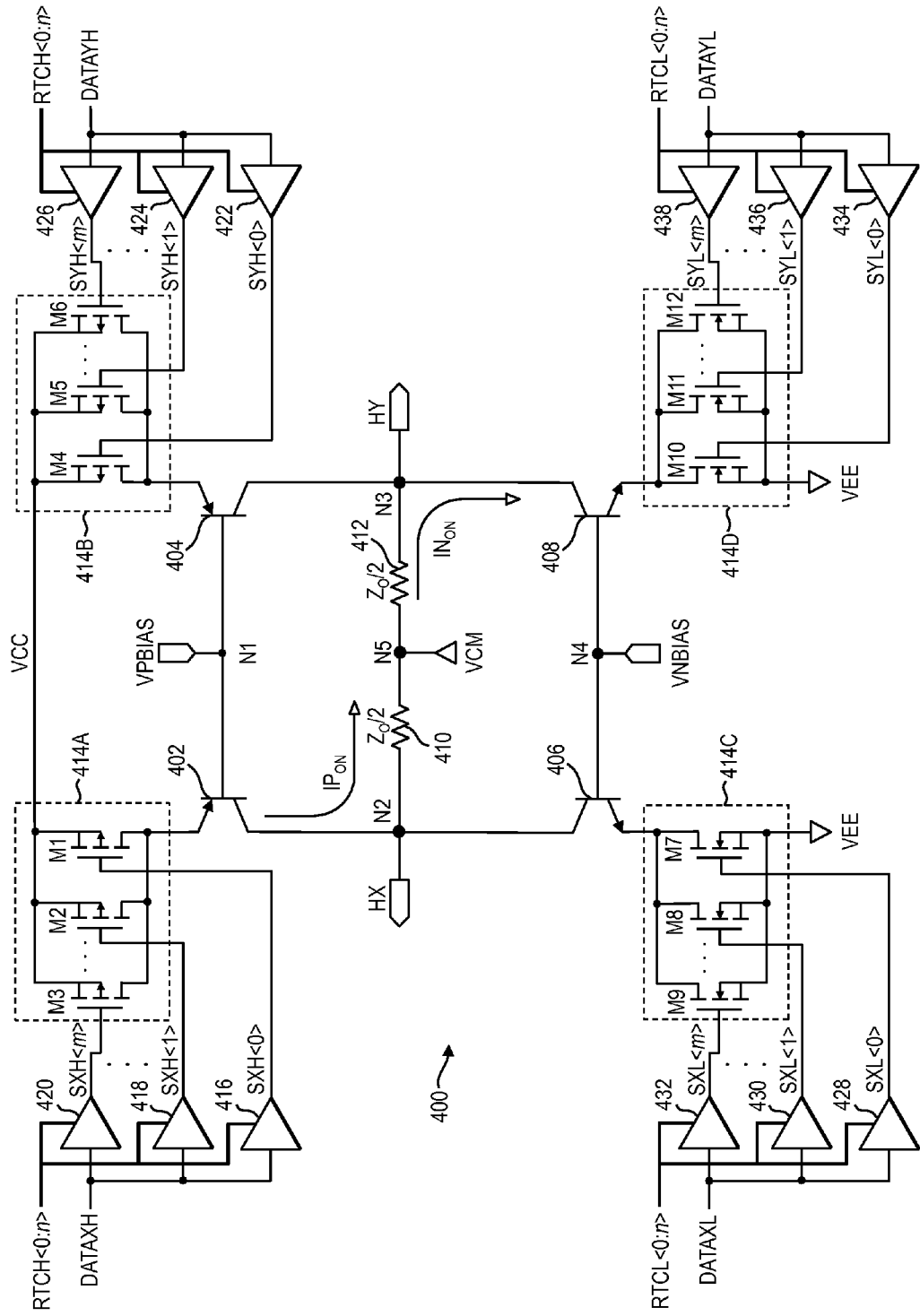
FIG. 4 is a schematic diagram depicting at least a portion of an exemplary driver circuit, according to an embodiment of the invention.

In accordance with one or more embodiments of the invention, a sensitivity of top and bottom power-on/off timing is beneficially reduced by utilizing rise-time control circuitry in the driver circuit. FIG. 4 is a schematic diagram depicting at least a portion of an exemplary driver circuit 400, according to an embodiment of the invention. As will be described in further detail below, the driver circuit 400 is connected in an H-bridge current driver configuration which incorporates programmable rise-time control as a function of digital rise-time control bits, RTCH<0:n> and RTCL<0:n>, supplied to the driver circuit, where n is an integer. This driver circuit 400 reduces the sensitivity of matching the top and bottom power-on/off timing by at least a factor of m, where m is the number of driver branches being enabled simultaneously.

It is to be understood that, in practice, the reduction factor in matching sensitivity between the top and bottom signal path circuitry is not necessarily expressed as a simple equation since there may be multiple boundary conditions that exist. However, assuming that the programmable delay is long compared to the mismatch in the top and bottom timing (which is a reasonable assumption for the illustrative driver circuit 400), then the reduction factor in matching sensitivity between the top and bottom signal path circuitry can be determined, to at least a close approximation, as a function of the number of delay paths generated in the driver circuit 400. As will become apparent to those skilled in the art given the teachings herein, the final sensitivity reduction amount can be determined based on driver slew rate, programmed delay and the number of delay paths employed in the driver.

With reference to FIG. 4, the driver circuit 400 includes an H-bridge core formed in a manner consistent with the H-bridge driver circuit 100 shown in FIG. 1, with some modifications. Specifically, the driver circuit 400 includes a first P-type transistor 402, which in this embodiment is a PNP BJT, a second P-type transistor 404, which in this embodiment is a PNP BJT, a first N-type transistor 406, which in this embodiment is an NPN BJT, and a second N-type transistor 408, which in this embodiment is an NPN BJT. Emitters of the PNP transistors 402 and 404 are coupled with a first voltage source, which in this embodiment is VCC (e.g., 5.0 volts), via first and second switching circuits 414A and 414B, respectively, bases of the PNP transistors are connected together at node N1 and are adapted to receive a first bias signal, which in this embodiment is VPBIAS, a collector of PNP transistor 402 is connected with a collector of NPN transistor 406 at node N2 and forms a first output, HX, of the driver circuit 400, and a collector of PNP transistor 404 is connected with a collector of NPN transistor 408 at node N3 and forms a second output, HY, of the driver circuit. Emitters of the NPN transistors 406 and 408 are coupled with a second voltage source, which in this embodiment is VEE or ground (e.g., −3.0 volts), via third and fourth switching circuits 414C and 414D, respectively, and bases of the NPN transistors are connected together at node N4 and are adapted to receive a second bias signal, which in this embodiment is VNBIAS. It is to be appreciated that embodiments of the invention are not limited to any specific voltage values for the first and second voltage sources or for the first and second bias signals.

The driver circuit 400 further includes common mode circuitry which, in this embodiment, comprises a load represented by first and second resistors, 410 and 412, connected in series across the outputs HX and HY. Specifically, a first terminal of the first resistor 410 is connected with the first output HX at node N2, a second terminal of resistor 410 is connected with a first terminal of the second resistor 412 at node N5, and a second terminal of resistor 412 is connected with the second output HY at node N3. In one or more embodiments, the voltage, VCM, at node N5 is driven by another circuit, or alternative voltage source, with low but finite output impedance to a voltage that is half-way between the two voltage sources VCC and VEE. The voltage, VCM, at node N5 forms an output common mode voltage of the driver circuit 400. The first and second resistors 410, 412 each have a resistance of $Z_0/2$, and therefore the common mode voltage VCM measured at node N5, under ideal operating conditions, will be half-way between the two voltage sources VCC and VEE; that is, VCM is driven to $$\frac{VCC + VEE}{2}.$$

The switching circuits 414A through 414D, in combination with corresponding enable control logic, form, in essence, a programmable impedance network which is used, in one or more embodiments, to control a rise-time of a write current, $I_W$, generated by the driver circuit 400. In one or more embodiments, each of the switching circuits comprises a plurality (m+1) of parallel current paths coupled between a corresponding voltage source (e.g., VCC or VEE) and an emitter of a corresponding one of the transistors in the H-bridge core (e.g., transistors 402, 404, 406 or 408). Each of the current paths is independently controlled using a switch element implemented, in this embodiment, by a PMOS or an NMOS FET device which is activated by corresponding control signals supplied thereto.

More particularly, switching circuit 414A includes a first PMOS transistor, M1, a second PMOS transistor, M2, and an (m+1)th PMOS transistor, M3, where (m+1) is the number of parallel current paths in the switching circuit. Each of the transistors M1, M2 and M3 has a source connected with the first voltage source VCC, a drain connected with the emitter of transistor 402 and a gate adapted to receive a corresponding control signal, SXH<0>, SXH<1> and SXH<m>, respectively. Each of the control signals SXH<0>, SXH<1> through SXH<m> is generated, in this embodiment, by a corresponding delay element. Specifically, control signal, SXH<0> is generated by a first delay element 416, control signal, SXH<1> is generated by a second delay element 418, and control signal, SXH<m> is generated by an (m+1)th delay element 420. The delay elements 416 through 420 are implemented, in one or more embodiments, using programmable delay buffers, each of the delay buffers having a delay value associated therewith which is programmable as a function of a first set of rise-time control bits, RTCH<0:n>, supplied thereto. Each of the delay elements 416 through 420 is adapted to receive, as an input thereto, a first input data signal, DATAXH, and the plurality of rise-time control bits RTCH<0:n>. In one or more embodiments, each of the delay elements 416 through 420 has a different delay increase per rise-time control setting (i.e., delay slope). For example, in some embodiments, delay element 420 has the most delay increase per rise-time control setting (RTCH<0: n>) and delay element 416 has the least delay increase per rise-time control setting; but all delays match for a rise-time control setting of zero (i.e., RTCH<0:n> are low). Although the rise-time control bits RTCH<0:n> could be static, in one more embodiments the rise-time control bits RTCH<0:n> are dynamic in that they set the rise-time to a slower setting for initial turn on and then change the rise-time to a faster setting for subsequent transitions, including data edges, in a data mode of operation in the switching circuit 414A.

Switching circuit 414B includes a first PMOS transistor, M4, a second PMOS transistor, M5, and an (m+1)th PMOS transistor, M6. Each of the transistors M4, M5 and M6 has a source connected with VCC, a drain connected with the emitter of transistor 404 and a gate adapted to receive a corresponding control signal, SYH<0>, SYH<1> and SYH<m>, respectively. Each of the control signals SYH<0> through SYH<m> is generated, in this embodiment, by a corresponding delay element. Control signal, SYH<0> is generated by a first delay element 422, control signal, SYH<1> is generated by a second delay element 424, and control signal, SYH<m> is generated by an (m+1)th delay element 426. The delay elements 422 through 426 are implemented, in one or more embodiments, using programmable delay buffers, each of the delay buffers having a delay value associated therewith which is programmable as a function of the first set of rise-time control bits RTCH<0:n>. Each of the delay elements 422 through 426 is adapted to receive, as an input thereto, a second input data signal, DATAYH, and the rise-time control bits RTCH<0:n>.

Switching circuit 414C includes a first NMOS transistor, M7, a second NMOS transistor, M8, and an (m+1)th NMOS transistor, M9. Each of the transistors M7, M8 and M9 has a source connected with the second supply voltage VEE, a drain connected with the emitter of transistor 406 and a gate adapted to receive a corresponding control signal, SXL<0>, SXL<1> and SXL<m>, respectively. Each of the control signals SXL<0>, SXL<1> through SXL<m> is generated, in this embodiment, by a corresponding delay element. Control signal, SXL<0> is generated by a first delay element 428, control signal, SXL<1> is generated by a second delay element 430, and control signal, SXL<m> is generated by an (m+1)th delay element 432. The delay elements 428 through 432 are implemented, in one or more embodiments, using programmable delay buffers, each of the delay buffers having a delay value associated therewith which is programmable as a function of a second set of rise-time control bits, RTCL<0:n>, supplied thereto. It is to be appreciated that in this embodiment, the second set of rise-time control bits RTCL<0:n> is logically equivalent to the first set of rise-time control bits RTCL<0:n> during normal operation (i.e., after a power-up sequence) but are logically different during the power-up sequence; they have been renamed to reflect the different power domains used for appropriately driving the NMOS or PMOS devices in the corresponding switching circuits; RTCH<0:n> being driven between VCC/VN12_VCC power rails and RTCL<0:n> being drive between VP12_VEENEE power supply rails. Each of the delay elements 428 through 432 is adapted to receive, as an input thereto, a third input data signal, DATAXL, and the second set of rise-time control bits RTCL<0:n>.

Likewise, switching circuit 414D includes a first NMOS transistor, M10, a second NMOS transistor, M11, and an (m+1)th NMOS transistor, M12. Each of the transistors M10, M11 and M12 has a source connected with the second supply voltage VEE, a drain connected with the emitter of transistor 408 and a gate adapted to receive a corresponding control signal, SYL<0>, SYL<1> and SYL<m>, respectively. Each of the control signals SYL<0>, SYL<1> through SYL<m> is generated, in this embodiment, by a corresponding delay element. Control signal, SYL<0> is generated by a first delay element 434, control signal, SYL<1> is generated by a second delay element 436, and control signal, SYL<m> is generated by an (m+1)th delay element 438. The delay elements 434 through 438 are implemented, in one or more embodiments, using programmable delay buffers, each of the delay buffers having a delay value associated therewith which is programmable as a function of the second set of rise-time control bits RTCL<0: n>. Each of the delay elements 434 through 438 is adapted to receive, as an input thereto, a fourth input data signal, DATAYL, and the second set of rise-time control bits RTCL<0:n>.

For each of a given one of the switch circuits 414A through 414D, each MOS transistor functions essentially as a switching element having a finite impedance associated therewith which varies as a function of a state of the device. As is well known by those skilled in the art, the resistance between the source and drain of an MOS transistor will be substantially high (e.g., millions of ohms) when the device is turned off (i.e., off state) and will be substantially low (e.g., a few ohms) when the device is turned on (i.e., on state). Thus, an impedance between the emitter and a corresponding voltage source of a given transistor in the H-bridge core will decrease as the number of active (i.e., enabled or turned on) MOS transistor devices in a corresponding switching circuit increases.

Since rise-time in the driver circuit 400 will be a function of the respective impedances in the top and bottom current paths, the switching circuits 414A through 414D and corresponding control logic (e.g., delay elements 416 through 438) form a programmable rise-time control circuit which is configured, in accordance with one or more embodiments, to reduce disturbances of the common mode voltage VCM. In one or more embodiments, rise-time control is implemented in the driver circuit 400 by sequentially turning on the multiple MOS devices in each of the current branches in the switching circuits 414A through 414D with prescribed delays between turn-on of each of the MOS devices. Thus, instead of turning on a single large MOS device (turning the output device from fully off to fully on in one step), a number of smaller MOS devices are used in parallel that are turned on sequentially to "soften" the turn on and thereby reduce the voltage disturbance on the output nodes N2 and N3 (HX and HY, respectively). Node N5 will also see a smaller voltage disturbance since the circuit or source driving N5 has a finite output impedance.

Some driver circuits provide rise-time control signals for setting the rise-time of write current polarity transitions. However, in such conventional driver circuits, the rise-time is set as a power-on default and the same values of the rise-time control signals are used for all modes of operation; namely, power-on/off modes as well as write current, $I_W$, data transitions during data mode. This approach either leads to the generation of disturbances in the common mode voltage level (if the rise-time is set too fast) or failure to meet prescribed read-to-write specifications (if the rise-time is set too slow), as previously stated; these two problems are mutually exclusive (i.e., correcting one problem exacerbates the other problem).

In order to achieve both of the above objectives (i.e., reducing disturbances in the common mode voltage level and meeting prescribed read-to-write specifications), aspects of the present disclosure beneficially adjust the rise-time (e.g., by modifying the rise-time control signals/bits accordingly) depending on the particular mode of operation of the driver circuit. In one or more embodiments, during power-on/off modes of operation of the driver circuit 400, the rise-time is set to a slower setting using the rise-time control bits RTCH<0:n> and RTCL<0:n>, and then after power-on but before normal operation the rise-time control bits are set to a faster (e.g., normal or default) rise-time control setting used for write current, $I_W$, transitions during a data (e.g., write) mode of operation of the driver circuit. That is, rise-time control is set differently for power-on/off modes of operation compared to a data mode of operation of the driver circuit 400 so as to reduce power-on/off common mode voltage disturbances.

The driver circuit 400 may include a detector circuit (not explicitly shown, but implied) to monitor the mode of operation of the driver circuit. The detector circuit may, in one or more embodiments, monitor transitions of the data enable signal (e.g., DataEn) and/or transitions of the input data signals (e.g., DATAXH) to thereby determine the operational mode of the driver circuit. For example, a power-on mode may be triggered upon detection of a low-to-high transition of the DataEn signal. Similarly, a power-off mode may be triggered upon detection of a high-to-low transition of the DataEn signal.

More particularly, in accordance with one or more embodiments of the invention, the rise-time control bits RTCH<0:n> and RTCL<0:n> are used to force slower rise-time settings (e.g., smaller number of active transistors in the switching circuits 414A through 414D) for initial power-on and final power-off transitions in the driver circuit 400, which do not need to meet the same stringent rise-time requirements associated with data transitions, but independent control of the rise-time is utilized for all or at least a portion of the data transitions. In this manner, the driver circuit according to one or more embodiments is configured to have a slower transition for power-on and power-off, and a faster transition for the data bits.

With continued reference to FIG. 4, in one or more embodiments, the number of current branches (e.g., through M1, M2, M3 controlled by an additional set of inputs), the number of programmable delay signals (e.g., SXH<0>, SXH<1>, SXH<m>, respectively), and the number of bits of rise-time control bits (e.g., RTCH<0:n>) used to select the programmable delay elements are all independent of one another. By way of illustration only and without limitation, assume that the number of current branches is equal to the number of delayed signals SXH<0:m>, SXL<0:m>, SYH<0:m> and SYL<0:m>. For example, when SXH<0> through SXH<m> are high, all switch elements M1, M2, M3 in the switching circuit 414A will be turned off, and therefore transistor 402 will output 0% of the available write current. When SXH<0> through SXH<m> are low, all switch elements M1, M2, M3 will be turned on, and therefore transistor 402 will output 100% of the available write current. In the embodiment shown in FIG. 4 having three distinct delay paths (m=2), the write current can be adjusted in discrete increments of one-third (i.e., 33% steps) of the total available current using three rise-time control bits. If four delay paths are used (m=3), the write current can be controlled in increments of one-quarter (i.e., 25% steps) of the total available current; and so on. It is to be understood that embodiments of the invention are not limited to any specific number of delay paths.

As a further conceptual illustration, by way of example only and without limitation, assume there is a mismatch in timing between the current source (high) side and current sink (low) side of t picoseconds (ps), such that the PNP transistor (e.g., transistor 402) turns on sooner than a corresponding NPN transistor (e.g., transistor 408). If all delays are equal, then the PNP transistor turns on completely introducing a common mode voltage disturbance that is proportional to a difference between source and sink currents $IP_{ON}$ and $N_{ON}$, respectively, at essentially any point in time. For high frequency, assume an external load, Z, is connected between the outputs HX and HY. For this load Z, using nodal analysis it can be shown that the following expression holds true:

$$\frac{HX + HY}{2} = VCM + (IP_{ON} - IN_{ON}) \cdot \frac{Z}{4}$$

When the NPN transistor turns on Δt ps later, the currents ($IP_{ON}$ and $IN_{ON}$) are matched and the common mode voltage returns to an expected level ([VCC+VEE]/2).

Now consider dividing the currents $IP_{ON}$ and $IN_{ON}$ flowing through the PNP and NPN transistors, respectively, into four separate paths, where each path is activated Δt later until all paths are turned on. In this case, the PNP transistor will first source 25% of the final current level (from the first current source path turning on) producing a common mode level that is proportional to one-quarter of its final amplitude, thereby reducing the common mode disturbance proportionally to 25% compared to the previous scenario. After a delay of Δt, the NPN transistor will sink 25% of its final current level (from the first current sink path turning on), thereby reducing the common mode voltage to its expected level.

After a delay of 2Δt, the PNP transistor will source an additional 25% (from the second current source path turning on) bringing the total current being sourced up to 50% of the final current level; a 25% difference between the source and sink currents. After a delay of 3Δt, the NPN transistor will source an additional 25% (from the second current sink path turning on) bringing the total current being sinked up to 50% of the final current level, thereby reducing the common mode voltage to its expected level again.

After a delay of 4Δt, the PNP transistor will source an additional 25% (from the third current source path turning on) bringing the total current being sourced up to 75% of the final current level; a 25% difference between the source and sink currents. After a delay of 5Δt, the NPN transistor will source an additional 25% (from the third current sink path turning on) bringing the total current being sinked up to 75% of the final current level, thereby reducing the common mode voltage to its expected level.

After a delay of 6Δt, the PNP transistor will source an additional 25% (from the fourth current source path turning on) bringing the total current being sourced up to 100% of the final current level; a 25% difference between the source and sink currents. Finally, after a delay of 7Δt, the NPN transistor will source an additional 25% (from the fourth current sink path turning on) bringing the total current being sinked up to 100% of the final current level, thereby reducing the common mode voltage to its expected level once again. Thus, in this illustrative scenario, the difference between the source and sink current paths does not exceed 25% at any given time, with a corresponding reduction in common mode voltage disturbance of at least 75% compared to turning on all current paths simultaneously as in the previous approach.

Figure 5:
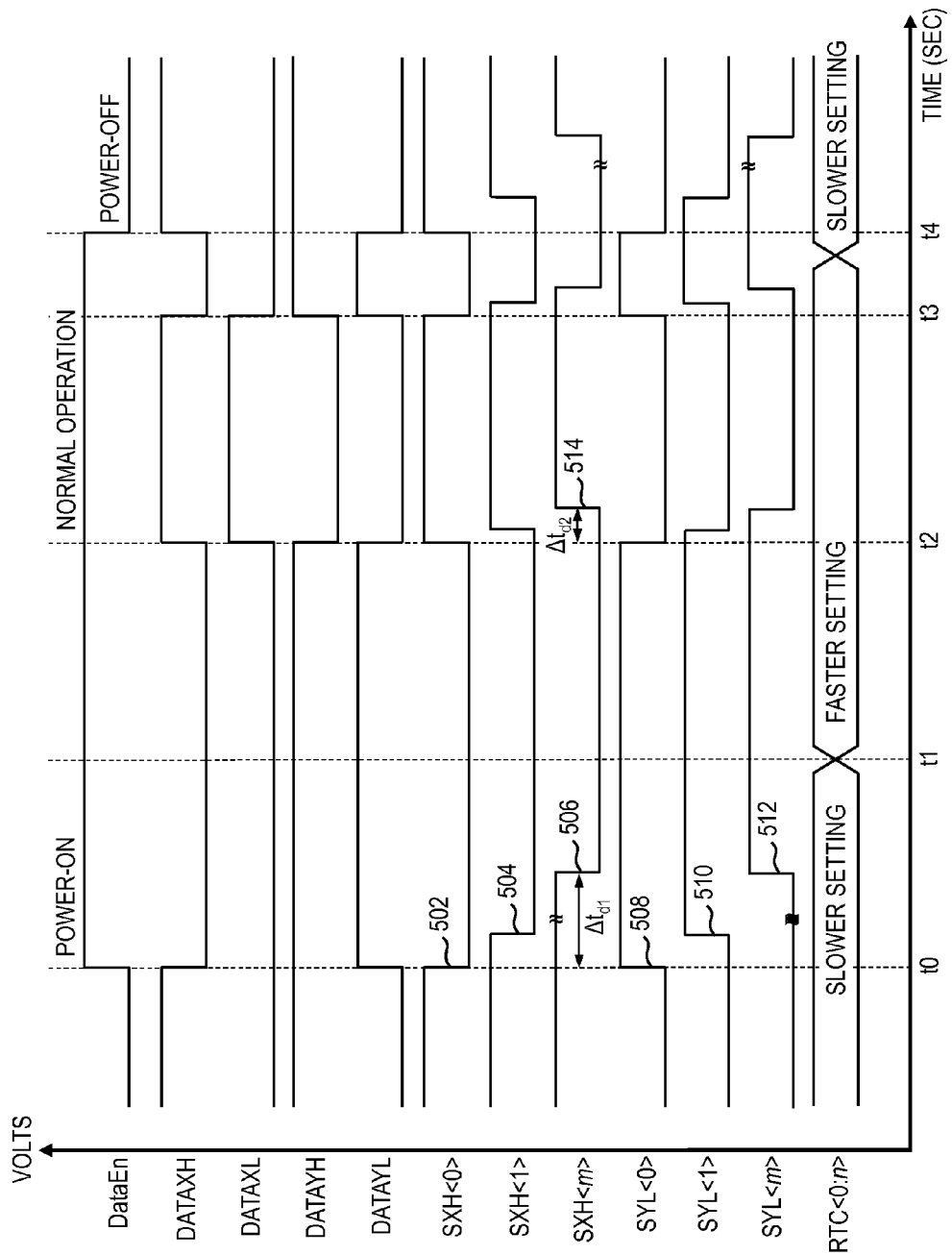
FIG. 5 depicts exemplary control signal waveforms corresponding to the driver circuit shown in FIG. 4 configured for reducing common mode voltage disturbance, according to an embodiment of the invention.

FIG. 5 depicts exemplary control signal waveforms corresponding to the driver circuit 400 shown in FIG. 4 configured for reducing common mode voltage disturbance, according to an embodiment of the invention. The waveforms shown in FIG. 5 relate to a power-on mode of operation of the driver circuit 400 according to one or more embodiments. In this example, the driver is turned off when DataEn is low and powers on when DataEn is asserted high. At time t0, the write data enable signal DataEn is asserted high which initiates the power-on mode of operation. As illustrated in FIG. 5, a slower rise-time control setting is used during power-on mode. This power-on mode continues for a prescribe amount, after which time operation of the driver circuit switches to a normal mode wherein a faster rise-time control setting is used, as shown at time t1. One or more of the data input signals, DATAXH, DATAXL, DATAYH and DATAYL, also transition at time intervals t0, t2, t3 and t4.

The remaining waveforms depicted in FIG. 5 relate to control signals, SXH<0>, SXH<1>, SXH<m>, SYL<0>, SYL<1>, and SYL<m>, generated by the delay elements 416, 418, 420, 434, 436 and 438, respectively, and RTC<0:n>, which collectively represent the rise-time control signals RTCH<0:n> and RTCL<0:n>. SXH<0> and SYL<0> have substantially no delay associated therewith and therefore transition essentially concurrently with the data transition intervals. This is evident, for example, by the alignment of the corresponding transition edges 502 and 508 of control signals SXH<0> and SYL<0>, respectively, with corresponding transition edges of DATAXH or DATAYL at t0, t2, t3 and t4. Each of the other control signals SXH<1>, SXH<m>, SYL<1> and SYL<m> have prescribed delays associated therewith and therefore transition a prescribed amount of time after time intervals t0, t2, t3 and t4, as evidenced by transition edges 504, 506, 510 and 512, respectively (corresponding to t0). The amount of delay associated with control signals SXH<1>, SXH<m>, SYL<1> and SYL<m> will vary depending on the value of m (i.e., based on the number of current paths used); the greater the value of m used, the greater the delay in transitioning of the control signal after the corresponding time interval (t0, t2, t3 or t4). That is, the more stages used, the longer the delay for a given rise-time control setting; except when the rise-time control is set to zero, where all delays match.

The rise-time control setting also changes the relative delay between stages, in accordance with one or more embodiments. For example, with reference to FIG. 5, during a slower setting of the rise-time control signals RTC<0:n>, a delay $\Delta t_{d1}$ between t0 and the transition edge 506 of control signal SXH<m> is greater than a delay $\Delta t_{d2}$ between t2 and the transition edge 514 of SXH<m> during a faster setting of the rise-time control signals. The same holds true for the other control signals SXH<1> and SYL<1>, which evidence a greater delay of their respective transition edges during the slower setting compared to during the faster setting of the rise-time control signals RTC<0:n>. For control signals SXH<0> and SYL<0> which do not exhibit a transition edge delay, the transition edges are essentially unaffected by the change in the rise-time control signals from the slower setting to the faster setting, as evident from FIG. 5. When DataEn goes low again at time t4, a power-off mode of operation is initiated, wherein the driver circuit switches back to the slower rise-time control settings.

Figure 6:
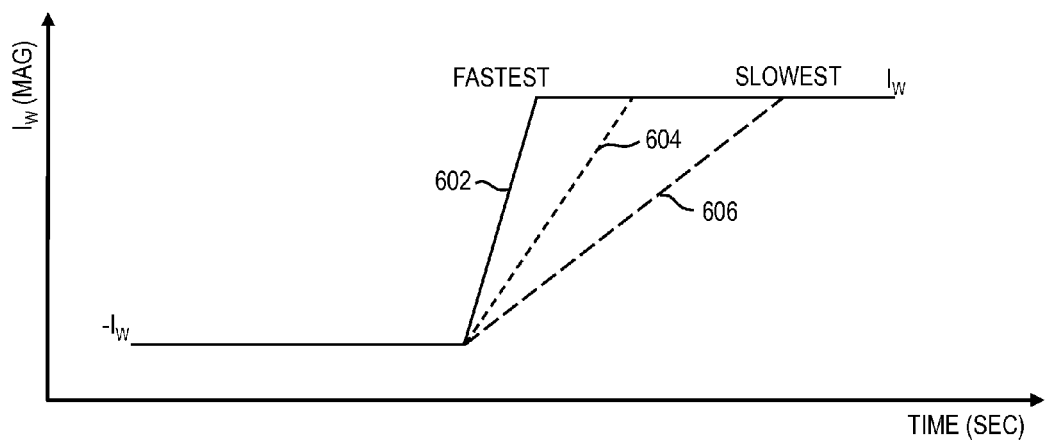
FIG. 6 conceptually depicts exemplary write current waveforms for various rise-time control settings, according to an embodiment of the invention.

FIG. 6 conceptually depicts exemplary write current $I_W$ waveforms for various rise-time control settings, according to an embodiment of the invention. With reference to FIG. 6, waveform 602 illustrates the write current $I_W$ with the rise-time control bits RTCH<0:n> and RTCL<0:n> configured to provide a fast rise-time (e.g., all bits RTCH<0:n> and RTCL<0:n> active), waveform 604 illustrates the write current $I_W$ with the rise-time control bits RTCH<0:n> and RTCL<0:n> configured to provide a slower rise-time compared to waveform 602 (e.g., some of bits RTCH<0:n> and RTCL<0:n> active and some of bits RTCH<0:n> and RTCL<0:n> inactive), and waveform 606 illustrates the write current $I_W$ with the rise-time control bits RTCH<0:n> and RTCL<0:n> configured to provide an even slower rise-time compared to waveforms 602 or 604 (e.g., all bits RTCH<0:n> and RTCL<0:n> inactive).

Figure 7:
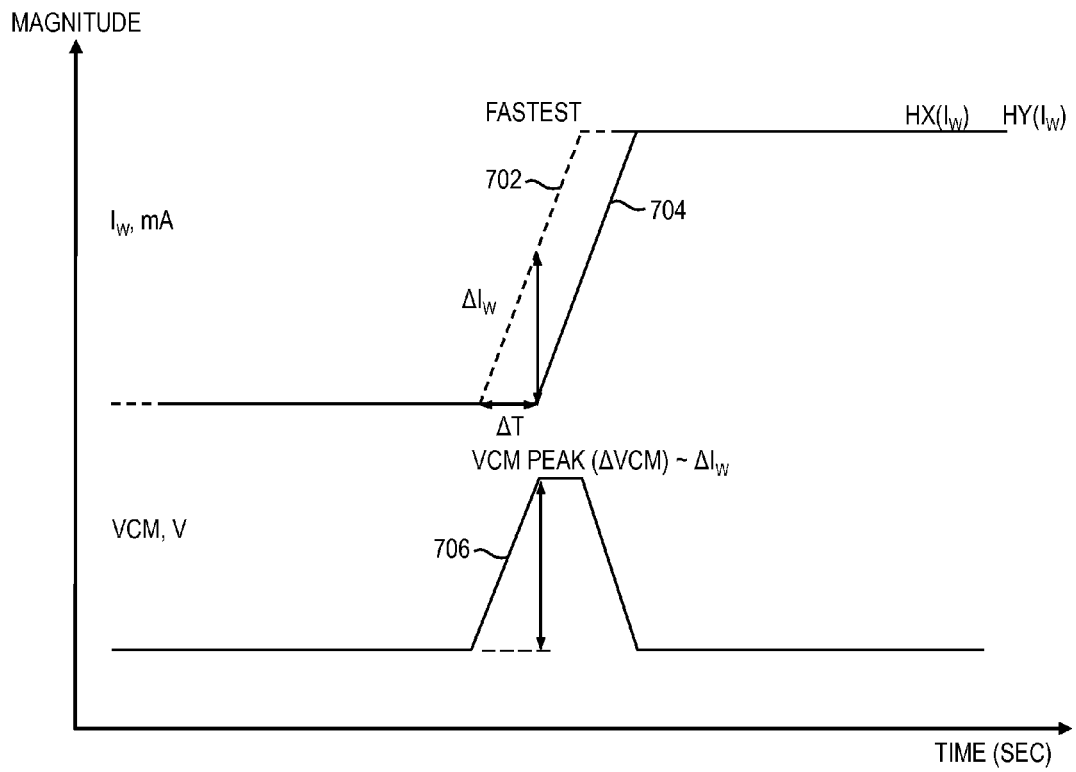
FIG. 7 conceptually depicts exemplary write current and common mode voltage disturbance waveforms for fast rise-time control settings, according to an embodiment of the invention.

FIG. 7 conceptually depicts exemplary write current $I_W$ and common mode voltage VCM waveforms common mode voltage disturbance for fast rise-time control settings, according to an embodiment of the invention. As apparent from FIG. 7, an illustrative data path timing mismatch results in the write current $I_W$ in the HX data output path (waveform 702) of the driver circuit 400 transitioning before the write current $I_W$ in the HY data output path (waveform 704) by an amount $\Delta T$. This $\Delta T$ timing mismatch translates into a write current differential $\Delta I_W$ between the two data paths that would otherwise be ideally balanced. The write current differential $\Delta I_W$ creates a corresponding disturbance, $\Delta VCM$, in the common mode voltage waveform 706. The magnitude of the common mode voltage disturbance $\Delta VCM$ is directly proportional to the magnitude of the time-based write current difference $\Delta I_W$.

Figure 8:
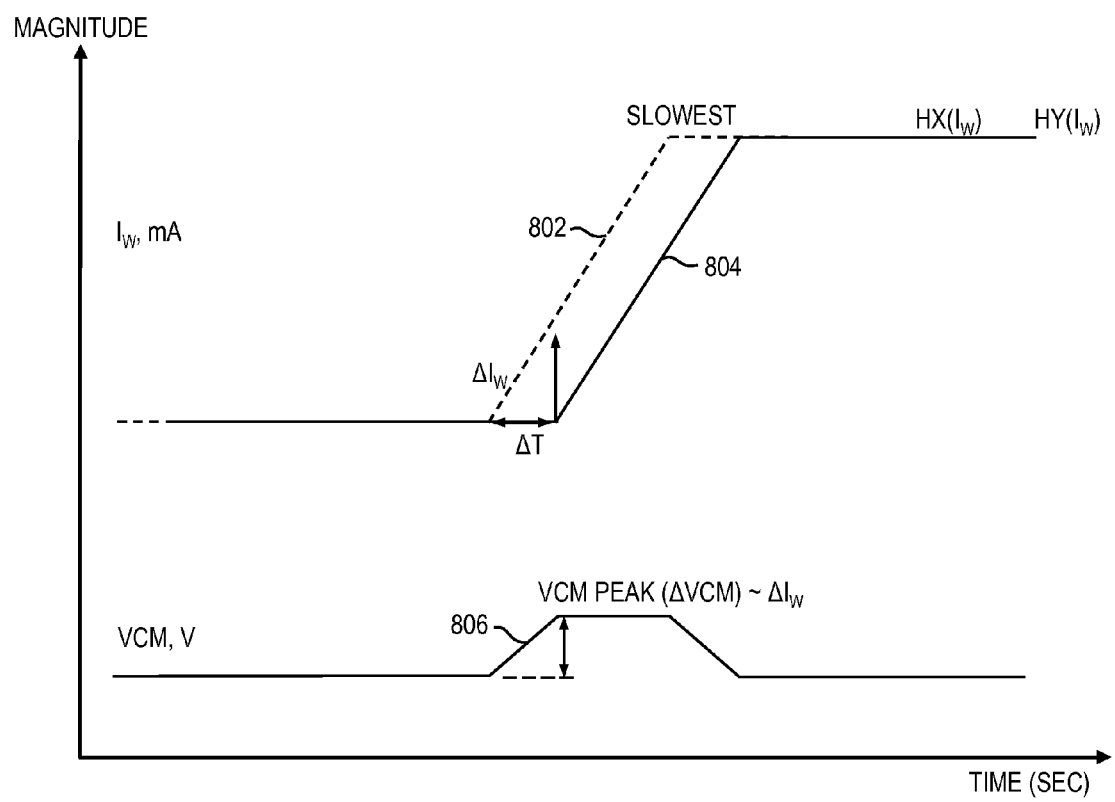
FIG. 8 conceptually depicts exemplary write current $I_W$ and common mode voltage VCM disturbance waveforms for slower rise-time control settings compared to FIG. 7, according to an embodiment of the invention.

FIG. 8 conceptually depicts exemplary write current $I_W$ and common mode voltage VCM waveforms common mode voltage disturbance for slower rise-time control settings compared to FIG. 7, according to an embodiment of the invention. As apparent from FIG. 8, an illustrative data path timing mismatch results in the write current $I_W$ in the HX data output path (waveform 802) of the driver circuit 400 transitioning before the write current $I_W$ in the HY data output path (waveform 804) by an amount $\Delta T$. This $\Delta T$ timing difference translates into a write current differential $\Delta I_W$ equal to $$I_W \cdot \frac{\Delta T}{t_{rise}},$$

where $t_{rise}$ is rise-time, between the two data paths that would otherwise be ideally balanced. However, with a slower rise-time compared to the rise-time settings used in the example of FIG. 7, the current differential for the slower rise-time scenario will be smaller in magnitude for the same timing difference $\Delta T$. The write current differential $\Delta I_W$ will be determined as $$\Delta I_W = \frac{\Delta T}{t_{rise\_slow}},$$

where $t_{rise\_slow}$ represents the rise-time using a slower rise-time control setting. The write current differential with slow rise-time, $\Delta I_{W\_slow}$, can be determined as $$\frac{t_{rise\_fast}}{t_{rise\_slow}} \cdot \Delta I_{W\_fast},$$

where $t_{rise\_fast}$ represents the rise-time using a faster rise-time control setting (compared to $t_{rise\_slow}$) and $\cdot \Delta I_{W\_fast}$ represents write current differential with fast rise-time. The write current differential $\Delta I_W$ creates a corresponding disturbance, $\Delta VCM$, in the common mode voltage waveform 806 which is substantially reduced compared to the disturbance of the common mode voltage for the faster rise-time setting, since the magnitude of the common mode voltage disturbance $\Delta VCM$ is directly proportional to the magnitude of the time-based write current difference $\Delta I_W$.

It is to be appreciated that in the exemplary embodiment shown in FIG. 4, there are multiple factors (i.e., boundary conditions) that will affect the amount of reduction in common mode voltage disturbance in the driver circuit 400, including, but not limited to, the amount of timing mismatch between current source and sink circuitry, the number of delay paths employed, the size of the programmable delay step for each delay path, and/or the analog turn on slew rate of each driver (since an active transistor device has a finite switching time associated therewith). One or more of these factors can be modified to meet certain design objectives depending on the application in which the driver circuit is used, as will become apparent to those skilled in the art given the teachings herein.

By way of example only and without limitation, exemplary calculations will be used to illustrate a beneficial reduction in common mode voltage disturbance achieved according to one or more embodiments of the invention. Assume, for this illustrative scenario, a write current $I_W$ with a rise-time of 100 picoseconds (ps) and a peak magnitude of 65 milliamperes (mA); during power-on, the write current will transition from 0 mA to 65 mA, for a peak-to-peak magnitude of 65 mA. Furthermore, assume there is a 20 ps timing error between the top and bottom data paths. This timing error will result in a corresponding current difference $\Delta I_W$ of $$13 \text{ mA } \left(\text{i.e., } \frac{65 \text{ mA}}{100 \text{ ps}} \times 20 \text{ ps} = 13 \text{ mA}\right).$$

For a system with a 50-ohm output impedance (i.e., Zo=50 ohms), the two common mode resistors 410 and 412 in FIG. 4 will each be equal to 25 ohms. Assuming an output resistance, Rout, of 10 ohms for a VCM regulator driving node N5, the common mode voltage disturbance $\Delta VCM$ will be about 293 millivolts (mV).

Assuming the voltage at HX (i.e., HX(V)) leads the voltage at HY (i.e., HY(V)) by 20 ps in the driver circuit 400 shown in FIG. 4, for a 100-ps rise-time, the common mode voltage disturbance $\Delta VCM$ can be calculated as follows:

$$VCM = (HX + HY)/2$$

$$HX(V) = I_W \cdot \frac{\Delta T}{t_{rise}} \cdot \left(\frac{Z_O}{2} + R_{O,VCM}\right)$$

$$HY(V) = I_W \cdot \frac{\Delta T}{t_{rise}} \cdot R_{O,VCM}$$

$$\Delta VCM =$$

-continued $$I_W \cdot \frac{\Delta T}{t_{rise}} \cdot \left(\frac{Z_O}{4} + R_{O,VCM}\right) = 65 \text{ mA} \cdot \frac{20 \text{ ps}}{100 \text{ ps}} \cdot \left(\frac{50\Omega}{4} + 10\Omega\right) = 292.5 \text{ mV}$$

By comparison, assuming the voltage at HX leads the voltage at HY by 20 ps in the driver circuit 400 shown in FIG. 4, for a 300-ps rise-time, the common mode voltage disturbance $\Delta VCM$ can be calculated using the above equation as follows:

$$\Delta VCM = 65 \text{ mA} \cdot \frac{20 \text{ ps}}{300 \text{ ps}} \cdot \left(\frac{50\Omega}{4} + 10\Omega\right) = 97.5 \text{ mV}$$

Since the rise-time is three times slower in this scenario (i.e., 300 ps vs. 100 ps), the common mode voltage disturbance $\Delta VCM$ is expected to be three times smaller, as evidenced above; that is, as shown in the exemplary calculations above, slowing the rise-time from 100 ps to 300 ps reduces the common mode voltage disturbance by a proportionate amount (e.g., from a magnitude of 292.5 mV to a magnitude of 97.5 mV).

As will be appreciated by those skilled in the art, at least a portion of embodiments of the present invention may be implemented as an apparatus, system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to as a "circuit," "module," "block," or "system." Furthermore, at least a portion of one or more embodiments of the present invention may take the form of a computer program product embodied in one or more non-transitory machine-readable medium(s) having machine-readable program code embodied thereon.

One or more embodiments of the invention, or elements thereof, can be implemented in the form of an apparatus including a memory and at least one processor coupled with the memory and configured to perform exemplary method steps in accordance with embodiments of the invention.

Figure 9:
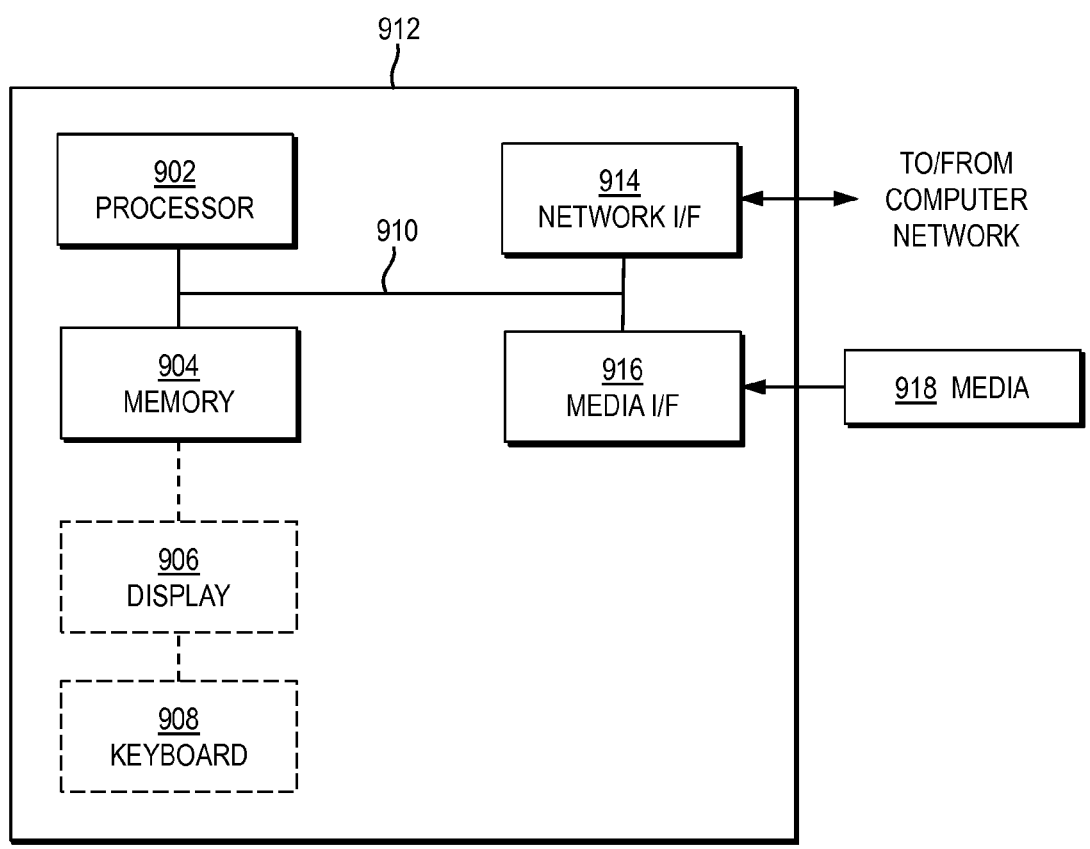
FIG. 9 depicts a computer system that may be useful in implementing at least a portion of one or more embodiments and/or elements of the invention.

One or more embodiments of the invention make use of software running on a general purpose computer or workstation which, when configured by the software, is transformed into a special purpose machine operative to perform methods in accordance with embodiments described herein. With reference to FIG. 9, such an implementation might employ, for example, a processor 902, a memory 904, and an input/output interface formed, for example, by a display 906 and a keyboard 908. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 902, memory 904, and input/output interface such as display 906 and keyboard 908 can be interconnected, for example, via bus 910 as part of a data processing unit 912. Suitable interconnections, for example via bus 910, can also be provided to a network interface 914, such as a network card, which can be provided to interface with a computer network, and to a media interface 916, such as a diskette or CD-ROM drive, which can be provided to interface with media 918.

Accordingly, computer software including instructions or code for performing methodologies according to embodiments of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 902 coupled directly or indirectly with memory elements 904 through system bus 910. The memory elements can include local memory employed during actual implementation of the program code, bulk storage, cache memories and embedded memory which provide temporary storage of at least a portion of program code in order to reduce the number of times the code must be retrieved from bulk storage during implementation.

Input/output or I/O devices (including but not limited to keyboards 908, displays 906, pointing devices, and the like) can be coupled to the system either directly (such as via bus 910) or through intervening I/O controllers (omitted for clarity).

Network adapters such as network interface 914 are also coupled with the system, in one or more embodiments of the invention, to enable the data processing system to become coupled with other data processing systems or remote printers or storage devices through intervening private or public networks. Modems, cable modem and Ethernet cards are just a few of the currently available types of network adapters.

As noted, one or more embodiments of the present invention may take the form of a computer program product embodied in one or more non-transitory machine- or computer-readable medium(s) having computer-readable program code embodied thereon. Any combination of one or more computer-readable medium(s) may be utilized. The computer-readable medium may be a computer readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. Media block 918 is a non-limiting example. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing. In one or more embodiments, a computer-readable storage medium is any tangible medium that can contain or store a program, in a non-transitory manner, for use by or in connection with an instruction execution system, apparatus, or device.

Computer program code for carrying out operations according to one or more embodiments of the invention are written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program code, in one or more embodiments, is loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing functions/acts specified in a flowchart and/or block diagram block or blocks.

The block diagrams in the figures depict illustrative architectures, functionality, and operation of implementations of systems, methods and computer program products according to embodiments of the present invention. In this regard, each block shown in the block diagrams may represent a module, segment, or portion of code, which comprises one or more executable instructions for implementing specified functions. It should also be noted that, in one or more embodiments, functions represented by the blocks may occur out of the order noted in the figures. For example, two blocks shown in succession may, in fact, be executed substantially concurrently, or the blocks may sometimes be executed in the reverse order, depending upon the functionality involved. It will also be appreciated that each block of the block diagrams, and combinations of blocks in the block diagrams, can be implemented by special purpose hardware-based systems that perform the specified functions or acts, or combinations of special purpose hardware and computer instructions.

It should be understood that any of the methods described herein can include an additional step of providing a system comprising distinct software modules embodied on a non-transitory computer-readable storage medium; the modules include, in one or more embodiments, any or all of the elements depicted in the block diagrams and/or described herein; by way of example and without limitation, a programmable current source and controller. The method steps can then be carried out using the distinct software modules and/or sub-modules of the system, executing on one or more hardware processors 902. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application-specific integrated circuits (ASICs), functional circuitry, one or more appropriately programmed general purpose digital computers with associated memory, and the like. Given the teachings of embodiments of the invention provided herein, one of ordinary skill in the related art will be able to contemplate other implementations of the components of the invention.

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Written Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Written Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method for reducing common-mode disturbances during power-on and power-off modal transitions in a current driver, the method comprising: providing a programmable current source operative to generate a current having a controllable rise-time; and controlling the programmable current source such that a rise-time of the current generated by the current driver is set to a first rise-time value during power-on and power-off modes of operation and is set to a second rise-time value during polarity transitions in a data mode of operation of the current driver, the first rise-time value being greater than the second rise-time value; wherein the programmable current source includes a plurality of switching circuits each including a plurality of switches, and wherein controlling the rise-time of the output current generated by the current driver comprises determining whether the current driver is operating in one of the power-on, power-off, and data modes, and sequentially activating the plurality of switches in each of the plurality of switching circuits to control the rise-time.

2. The method of claim 1, wherein controlling the rise time of the output current generated by the current driver comprises generating a digital control signal supplied to the programmable current source, the digital control signal being a function of the mode of operation of the current driver.

3. The method of claim 2, further comprising setting the rise time of the output current to a prescribed value during power-on and power-off modes of operation in the current driver, and controlling the rise time of the output current as a function of the digital control signal during the data mode of operation in the current driver.

4. The method of claim 1, wherein the rise time is adjusted so that a peak amplitude of the common mode disturbance during at least one of the power-on and power-off modal transitions in the current driver is less than a prescribed value.

5. The method of claim 1, further comprising providing a plurality of parallel current paths in the programmable current source, each of the current paths being independently controlled using a switch element.

6. The method of claim 5, wherein the switch elements associated with the respective current paths are adapted to receive digital rise-time control bits supplied to the current driver.

7. The method of claim 5, wherein controlling the programmable current source comprises selecting a number of the parallel current paths as a function of the mode of operation of the current driver.

8. The method of claim 5, further comprising configuring each of at least a subset of the plurality of parallel current paths in the programmable current source so that a first selected current path is activated a first delay after assertion of a power-on signal supplied to the current driver, and at least a second selected current path is activated a second delay after assertion of the power-on signal, the first delay being different than the second delay.

9. The method of claim 5, further comprising configuring the programmable current source so that there is a first delay between activation of successive parallel current paths during the power-on and power-off modes of operation, and there is at least a second delay between activation of successive parallel current paths during the data mode of operation, the first and second delays being different relative to one another.

10. A current driver circuit for reducing common-mode disturbances during power-on and power-off modal transitions, the current driver circuit comprising:
  a programmable current source, the programmable current source configured to generate a current as a function of at least one control signal;
  an output driver stage coupled with the programmable current source, the output stage being configured to receive the current from the programmable current source and to generate an output current of the driver circuit, the output stage being configured to control polarity transitions of the output current; and
  a controller coupled with the programmable current source, the controller generating the at least one control signal and being configured to control a rise-time of the output current such that the rise-time of the output current is greater during power-on and power-off modes of operation of the current driver circuit than in a data mode of operation of the current driver circuit, the data mode including a write operation.

11. The current driver circuit of claim 10, further comprising a detector circuit configured to determine whether the current driver circuit is operating in one of the power-on, power-off, and data modes, wherein the programmable current source includes a plurality of switching circuits each including a plurality of switches, and the controller is configured to control the rise time by sequentially activating the plurality of switches in each of the plurality of switching circuits.

12. The current driver circuit of claim 10, wherein the controller is configured to generate a digital control signal supplied to the programmable current source, the digital control signal having a value that is a function of the mode of operation of the current driver circuit.

13. The current driver circuit of claim 12, wherein the controller is configured to set the rise-time of the output current to a prescribed value during power-on and power-off modes of operation in the current driver circuit, and to vary the rise-time of the output current as a function of the digital control signal during the data mode of operation in the current driver circuit.

14. The current driver circuit of claim 10, wherein the controller is configured to adjust the rise-time so that a peak amplitude of the common mode disturbances during at least one of the power-on and power-off modal transitions in the current driver circuit is less than a prescribed value.

15. The current driver circuit of claim 10, wherein the programmable current source comprises a plurality of parallel current paths in the programmable current source, each of the current paths being independently controlled.

16. The current driver circuit of claim 15, wherein each of at least a subset of the plurality of parallel current paths comprises a switch element configured to connect the output driver stage to a corresponding voltage source as a function of the at least one control signal.

17. The current driver circuit of claim 16, wherein the programmable current source comprises a plurality of delay elements, each delay element connected with a corresponding switch element and having a delay value associated therewith, at least two of the delay elements having different delay values relative to one another.

18. The current driver circuit of claim 17, wherein each of at least a subset of the delay elements is adapted to receive digital rise-time control bits and a data input signal supplied thereto and is operative to generate the at least one control signal for controlling a corresponding switch element as a function of the rise-time control bits and data input signal.

19. The current driver circuit of claim 10, wherein the output driver stage comprises an H-bridge core circuit.

* * * * *